United States Patent
Deguchi

(10) Patent No.: US 9,117,973 B2
(45) Date of Patent: Aug. 25, 2015

(54) SEMICONDUCTOR LIGHT EMITTING ELEMENT

(75) Inventor: Masashi Deguchi, Kiyosu (JP)

(73) Assignee: TOYODA GOSEI CO., LTD., Kiyosu-Shi, Aichi-Ken (JP)

(*) Notice: Subject to any disclaimer, the term of this patent is extended or adjusted under 35 U.S.C. 154(b) by 0 days.

(21) Appl. No.: 13/317,692

(22) Filed: Oct. 26, 2011

(65) Prior Publication Data
US 2012/0146075 A1 Jun. 14, 2012

(30) Foreign Application Priority Data

Dec. 8, 2010 (JP) ................................. 2010-273485

(51) Int. Cl.
*H01L 33/00* (2010.01)
*H01L 33/42* (2010.01)
*H01L 33/38* (2010.01)
*H01L 33/46* (2010.01)
*H01L 33/32* (2010.01)

(52) U.S. Cl.
CPC ................ *H01L 33/42* (2013.01); *H01L 33/38* (2013.01); *H01L 33/46* (2013.01); *H01L 33/32* (2013.01)

(58) Field of Classification Search
CPC ...... H01L 33/145; H01L 33/405; H01L 33/10
USPC ......... 257/98, 103, E33.062, 190; 438/22, 24
See application file for complete search history.

(56) References Cited

U.S. PATENT DOCUMENTS

| | | | |
|---|---|---|---|
| 6,327,413 B1* | 12/2001 | Kinoshita | 385/129 |
| 6,465,812 B1* | 10/2002 | Hosoba et al. | 257/103 |
| 6,794,688 B2* | 9/2004 | Nakatsu et al. | 257/98 |
| 7,109,048 B2* | 9/2006 | Ha et al. | 438/22 |
| 7,119,372 B2* | 10/2006 | Stokes et al. | 257/79 |
| 7,145,180 B2* | 12/2006 | Shinohara et al. | 257/85 |
| 7,372,081 B2* | 5/2008 | Song et al. | 257/99 |
| 7,666,693 B2* | 2/2010 | Song et al. | 438/22 |
| 8,263,991 B2* | 9/2012 | Huang et al. | 257/98 |

(Continued)

FOREIGN PATENT DOCUMENTS

| | | |
|---|---|---|
| JP | 2001-291899 A | 10/2001 |
| JP | 2004-200303 A | 7/2004 |

(Continued)

OTHER PUBLICATIONS

Chinese Office Action dated Dec. 27, 2013, with English translation.
Japanese Office Action dated Oct. 8, 2013 with partial English translation thereof.
Decision of Final Rejection dated Mar. 3, 2015 with partial English translation.

*Primary Examiner* — Bradley K Smith
*Assistant Examiner* — David Goodwin
(74) *Attorney, Agent, or Firm* — McGinn IP Law Group, PLLC

(57) ABSTRACT

A semiconductor light emitting element includes a semiconductor multilayer structure including a first conductive type layer, a second conductive type layer and a light emitting layer sandwiched between the first conductive type layer and the second conductive type layer, a first transparent electrode formed on the second conductive type layer, a reflecting layer formed on the first transparent electrode, and including a smaller area than the first transparent electrode, a second transparent electrode formed on the first transparent electrode so as to cover the reflecting layer, and a pad electrode formed on the second transparent electrode and in a region above the reflecting layer.

11 Claims, 6 Drawing Sheets

(56) References Cited

U.S. PATENT DOCUMENTS

| | | |
|---|---|---|
| 2004/0113170 A1 | 6/2004 | Murakami et al. |
| 2005/0087884 A1* | 4/2005 | Stokes et al. .................. 257/778 |
| 2005/0139825 A1* | 6/2005 | Song et al. ...................... 257/44 |
| 2006/0071226 A1 | 4/2006 | Kojima et al. |
| 2009/0146165 A1* | 6/2009 | Hasnain et al. ................. 257/98 |
| 2010/0207160 A1* | 8/2010 | Park .............................. 257/103 |

FOREIGN PATENT DOCUMENTS

| | | |
|---|---|---|
| JP | 2006-108161 A | 4/2006 |
| JP | 2008-192690 | 8/2008 |
| JP | 2008-300719 A | 12/2008 |

* cited by examiner

SEMICONDUCTOR LIGHT EMITTING ELEMENT

The present application is based on Japanese patent application No. 2010-273485 filed on Dec. 8, 2010, the entire contents of which are incorporated herein by reference.

BACKGROUND OF THE INVENTION

1. Field of the Invention

This invention relates to a semiconductor light emitting element.

2. Description of the Related Art

JP-A-2008-300719 discloses a semiconductor light emitting element that includes a reflecting layer under a pad electrode in order to prevent light emitted from a light emitting layer from being absorbed by the pad electrode.

SUMMARY OF THE INVENTION

It is an object of the invention to provide a semiconductor light emitting element that can offer improved light extraction efficiency while having the reflecting layer under the pad electrode.

(1) According to one embodiment of the invention, a semiconductor light emitting element, comprising:

a semiconductor multilayer structure comprising a first conductive type layer, a second conductive type layer and a light emitting layer sandwiched between the first conductive type layer and the second conductive type layer;

a first transparent electrode formed on the second conductive type layer;

a reflecting layer formed on the first transparent electrode, and comprising a smaller area than the first transparent electrode (in a plan or top view);

a second transparent electrode formed on the first transparent electrode so as to cover the reflecting layer; and a pad electrode formed on the second transparent electrode and in a region right above the reflecting layer.

In the above embodiment (1) of the invention, the following modifications and changes can be made.

(i) The reflecting layer further comprises a metal and a transparent insulating material formed on an entire surface of the metal.

(ii) A contact region of the first transparent electrode and the second transparent electrode surrounds a periphery of a bottom surface of the reflecting layer.

Effects of the Invention

According to one embodiment of the invention, a semiconductor light emitting element can be provided that can offer improved light extraction efficiency while having the reflecting layer under the pad electrode.

BRIEF DESCRIPTION OF THE DRAWINGS

The preferred embodiments according to the invention will be explained below referring to the drawings, wherein.

DETAILED DESCRIPTION OF THE PREFERRED EMBODIMENTS

Figure 1:
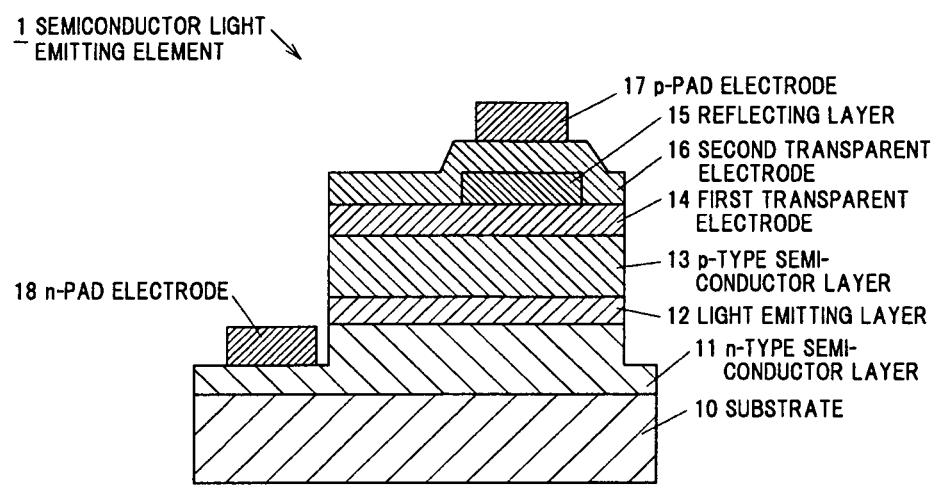
FIG. 1 is a vertical cross-sectional view schematically showing a semiconductor light emitting element according to an embodiment of the invention.
Figure 2:
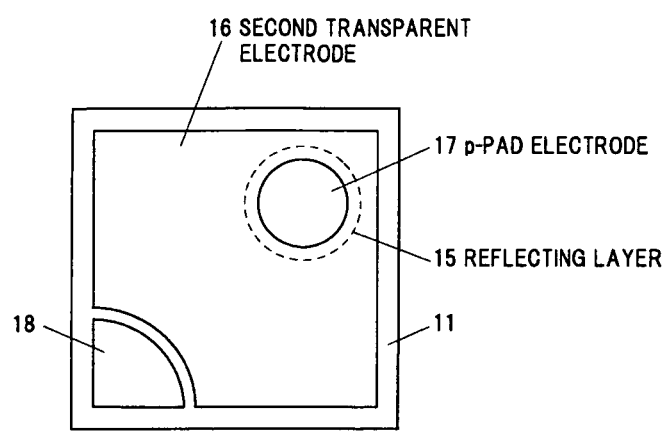
FIG. 2 is a top view schematically showing the semiconductor light emitting element according to the embodiment of the invention.

FIG. 1 is a vertical cross-sectional view schematically showing a semiconductor light emitting element according to an embodiment of the invention and FIG. 2 is a top view schematically showing the semiconductor light emitting element according to the embodiment of the invention.

A semiconductor light emitting element 1 includes a semiconductor structure including an n-type semiconductor layer 11, a p-type semiconductor layer 13 and a light emitting layer 12 sandwiched between the f n-type semiconductor layer 11 and the p-type semiconductor layer 13, and is a face-up type light emitting element in which a light is extracted from a side of the p-type semiconductor layer 13 of the light emitting layer 12. The n-type semiconductor layer 11 is formed on a substrate 10.

A first transparent electrode 14 is formed on the p-type semiconductor layer 13. A reflecting layer 15 that has a small area than the first transparent electrode 14 is formed on the first transparent electrode 14. A second transparent electrode 16 is formed on the first transparent electrode 14 so as to cover the reflecting layer 15. A p-pad electrode 17 is formed on the second transparent electrode 16 in a region located above the reflecting layer 15. In addition, an n-pad electrode 18 is formed on a region in which the n-type semiconductor layer 11 is exposed.

The n-type semiconductor layer 11, the light emitting layer 12 and the p-type semiconductor layer 13 are respectively a layer formed of III group nitride compound semiconductor. As the III group nitride compound semiconductor, for example, a quaternary III group nitride compound semiconductor represented by a formula of $Al_xGa_yIn_{1-x-y}N$ (here, $0 \leq x \leq 1$, $0 \leq y \leq 1$, $0 \leq x+y \leq 1$) can be used.

The n-type semiconductor layer 11 has a multilayer structure including, for example, an n-type contact layer, an n-type ESD layer and an n-type clad layer, and each layer is formed of an n-GaN that is respectively doped with a predetermined amount of an n-type dopant such as Si.

The light emitting layer 12 has a multiple quantum structure formed by including a plurality of quantum well layers and a plurality of barrier layers. The quantum well layer is formed of, for example, InGaN, and the barrier layer is formed of, for example, GaN, AlGaN or the like.

The p-type semiconductor layer 13 has a multilayer structure including, for example, a p-type clad layer and a p-type contact layer, and each layer is formed of a p-GaN that is respectively doped with a predetermined amount of a p-type dopant such as Mg.

The n-type semiconductor layer 11, the light emitting layer 12 and the p-type semiconductor layer 13 are formed by, for example, growing a crystal on the substrate 10 by using Metal Organic Chemical Vapor Deposition (MOCVD) method, Molecular Beam Epitaxy (MBE) method, or Halide Vapor Phase Epitaxy (HVPE) method.

The substrate 10 is, for example, a sapphire substrate.

The first transparent electrode 14 and the second transparent electrode 16 have a function that diffuses electrical current flowing from the p-pad electrode 17 to the p-type semiconductor layer 13 uniformly. The first transparent electrode 14 and the second transparent electrode 16 are formed of, for example, Indium Tin Oxide (ITO), and are formed by using Vacuum Deposition method, Sputtering method or CVD method.

In particular, it is preferable that the first transparent electrode 14 is formed by Sputtering method so as to ensure flatness of the upper surface. In case that the upper surface of the first transparent electrode 14 has high flatness, the bottom surface of the reflecting layer 15 that is formed on the first transparent electrode 14 has high flatness, thus it becomes difficult for the light reflected by the reflecting layer 15 to be diffused, and the light extraction efficiency of the semiconductor light emitting element 1 is enhanced.

The reflecting layer 15 has a function that reflects the light emitted from the light emitting layer 12 to a side of the p-type semiconductor layer 13 (in the direction of the light extraction direction). In case that the p-pad electrode 17 is formed of a material having a low optical reflectance, the light emitted from the light emitting layer 12 is absorbed by the p-pad electrode 17, thereby the light extraction efficiency of the semiconductor light emitting element 1 is decreased. Consequently, the p-pad electrode 17 is located above the reflecting layer 15, and the light emitted from the light emitting layer 12 to the p-pad electrode 17 is reflected by the reflecting layer 15 so as to be extracted from the other region, thereby the semiconductor light emitting element 1 can be prevented from the decrease in the light extraction efficiency.

The reflecting layer 15 is formed of a metal, a transparent insulating material or a metal of which surface is covered with the transparent insulating material. A metal used as a material of the reflecting layer 15 has a higher reflectance to the light emitted from the light emitting layer 12 than the p-pad electrode 17. In addition, a transparent insulating material used as a material of the reflecting layer 15 has a lower refraction index than the first transparent electrode 14, thus the light emitted from the light emitting layer 12 can be reflected due to the difference in the refraction index.

In case that a metal is used as a material of the reflecting layer 15, the light emitted from the light emitting layer 12 to the p-pad electrode 17 can be reflected at a high reflectance. The reflecting layer 15 formed of a metal is formed of, for example, Al, Ag, Rh, Pt, or an alloy containing at least one of the metals as a main component, and can be formed by using Sputtering method or Deposition method.

In addition, in case that a transparent insulating material is used as a material of the reflecting layer 15, if a light enters into the interface between the second transparent electrode 16 and the reflecting layer 15 at an angle of exceeding critical angle, total reflection occurs, thus the light is reflected without absorption. The reflecting layer 15 formed of the transparent insulating material is formed of, for example, $SiO_2$, and can be formed by using CVD method, Sputtering method or Deposition method.

Figure 3:
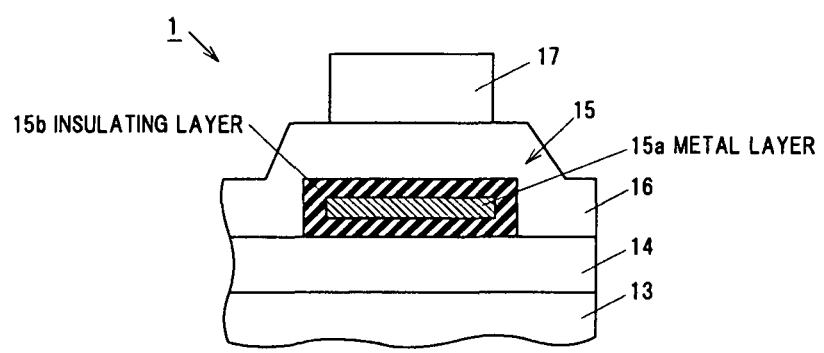
FIG. 3 is a partial enlarged view schematically showing a reflecting layer used in the embodiment of the invention, in case that the reflecting layer includes a metal layer and an insulating layer covering the surface of the metal layer.

Furthermore, in case that the reflecting layer 15 is formed of a metal of which surface is covered with transparent insulating material, a light that enters into the interface between the second transparent electrode 16 and the reflecting layer 15 at an angle of exceeding critical angle is reflected without absorption by the transparent insulating material, and the light that enters at an angle of not exceeding critical angle is transmitted through the transparent insulating material, but is reflected by the reflecting layer 15. By the above-mentioned structure, a reflecting layer in which absorption and transmission of a light are prevented so as to have a high efficiency can be obtained. FIG. 3 is a partial enlarged view schematically showing the reflecting layer 15, in case that the reflecting layer 15 includes a metal layer 15a and a transparent insulating layer 15b covering the surface of the metal layer 15a. In this case, it is preferable that the metal layer 15a is not in contact with the first transparent electrode 14 and the second transparent electrode 16.

The p-pad electrode 17 and the n-pad electrode 18 are an electrode for connecting a bonding wire and the like, and are formed of a conductive material such as Au. Electrical voltage is applied to the n-type semiconductor layer 11 and the p-type semiconductor layer 13 via the p-pad electrode 17 and the n-pad electrode 18, thereby a light is emitted from the light emitting layer 12. The p-pad electrode 17 and the n-pad electrode 18 can be formed by using Sputtering method, Deposition method or the like.

Figure 4:
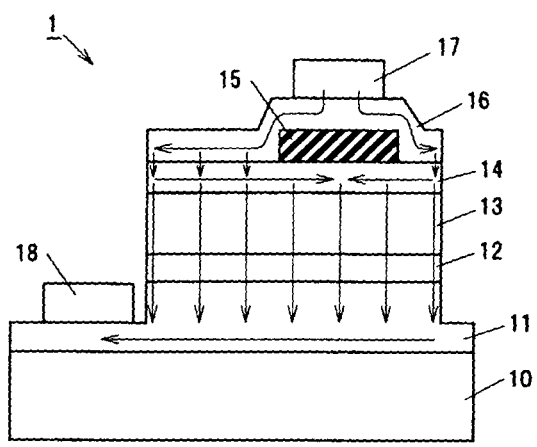
FIG. 4 is an explanatory view conceptually showing a flow of electrical current in the semiconductor light emitting element according to the embodiment of the invention.

FIG. 4 is an explanatory view conceptually showing a flow of electrical current in the semiconductor light emitting element 1 according to the embodiment. Arrow marks in FIG. 4 conceptually show a flow of electrical current.

Electrical current that flows from the p-pad electrode 17 to the first transparent electrode 14 via the second transparent electrode 16 flows in the first transparent electrode 14 in the in-plane direction. Thus, electrical current flows from almost the whole region including a region under the reflecting layer 15 of the first transparent electrode 14 to the p-type semiconductor layer 13, and almost the whole region of the light emitting layer 12 emits a light.

The semiconductor light emitting element 1 has a higher light emission output and almost the same forward voltage (Vf) of the element voltage in comparison with a typical conventional semiconductor light emitting element that does not have the reflecting layer 15 and the second transparent electrode 16.

It is considered that the fact that the semiconductor light emitting element 1 has a higher light emission output in comparison with a typical conventional semiconductor light emitting element is due to the fact that almost the whole region of the light emitting layer 12 emits a light, and further the reflecting layer 15 reflects the light directed toward p-pad electrode 17. In addition, it is considered that the fact that the semiconductor light emitting element 1 has almost the same forward voltage (Vf) as the typical conventional semiconductor light emitting element is due to the fact that electrical current flows almost uniformly in the semiconductor structure, as with a case that the reflecting layer 15 does not exist.

As shown in FIGS. 1 to 4, it is preferable that the contact region of the first transparent electrode 14 and the second transparent electrode 16 surrounds a periphery of the bottom surface of the reflecting layer 15. This allows electrical current to flow more uniformly in a region under the reflecting layer 15 of the light emitting layer 12. Further, much the same is true on a case that the reflecting layer 15 has a different shape.

Figure 5:
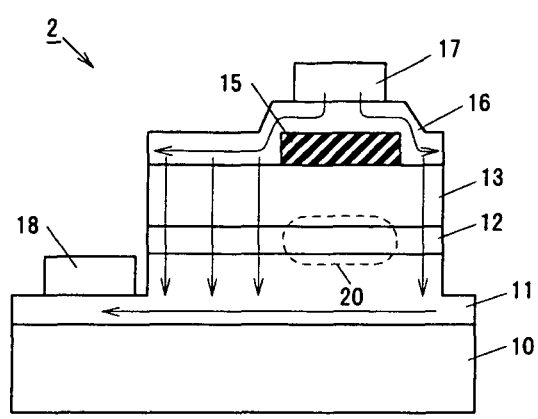
FIG. 5 is an explanatory view conceptually showing a flow of electrical current in a semiconductor light emitting element according to the comparative example.

FIG. 5 is an explanatory view conceptually showing a flow of electrical current in a semiconductor light emitting element 2 according to the comparative example. The semiconductor light emitting element 2 has a configuration that the first transparent electrode 14 is eliminated from the configuration of the semiconductor light emitting element 1.

In the semiconductor light emitting element 2, electrical current flows from the second transparent electrode 16 to the p-type semiconductor layer 13 directly. The p-type semiconductor layer 13 has a high electrical resistance, and electrical current hardly flows in an in-plane direction, thus electrical current hardly flows in a region under the reflecting layer 15 of the p-type semiconductor layer 13, thereby a light emission is hardly caused in a region 20 below the reflecting layer 15 of the light emitting layer 12.

The semiconductor light emitting element 2 has a higher light emission output, but also has a higher forward voltage (Vf) of the element voltage in comparison with a typical conventional semiconductor light emitting element that does not have the reflecting layer 15 and the second transparent electrode 16. It is considered that the fact that the semiconductor light emitting element 2 has a higher forward voltage (Vf) of the element voltage is due to the fact that electrical current concentrates in a region other than the region under the reflecting layer 15 of the p-type semiconductor layer 13.

Figure 6A:
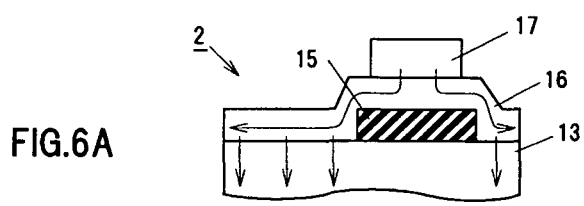
FIGS. 6A to 6D are enlarged views schematically showing a concrete example of the semiconductor light emitting element according to the comparative example.

FIGS. 6A to 6D are enlarged views schematically showing a concrete example of the semiconductor light emitting element 2 according to the comparative example. FIG. 6A shows an example in a case that the reflecting layer 15 is formed of an insulating material. The second transparent electrode 16 is contact with only a region of a periphery of the reflecting layer 15, thus electrical current hardly flows in a region under the reflecting layer 15 of the p-type semiconductor layer 13.

Figure 6B:
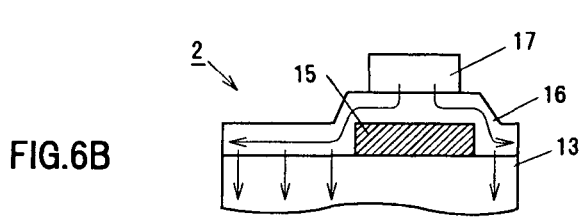

FIG. 6B shows an example in a case that the reflecting layer 15 is formed of a metal. In the example, it is supposed that Al having a high reflectance is used. In this case, Al cannot be brought into ohmic contact with the p-type semiconductor layer 13, thus electrical current hardly flows in a region under the reflecting layer 15 of the p-type semiconductor layer 13.

Figure 6C:
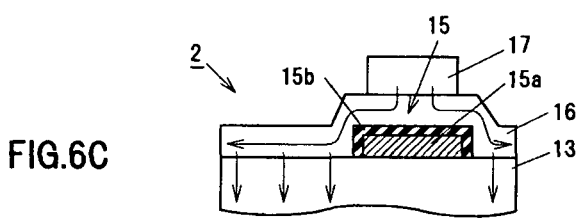

FIG. 6C shows an example in a case that the reflecting layer 15 is formed of the metal layer 15a and the insulating layer 15b covering the upper surface and the side surface of the metal layer 15a. In this case, due to the insulating layer 15b, electrical current hardly flows in a region under the reflecting layer 15 of the p-type semiconductor layer 13. Further, in the example, it is supposed that Ag having a high reflectance but remarkably causing an electromigration is used as a material of the metal layer 15a.

Figure 6D:
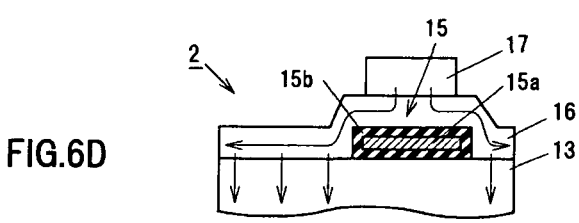

FIG. 6D shows an example in a case that the reflecting layer 15 is formed of the metal layer 15a and the insulating layer 15b covering the surface of the metal layer 15a. In this case, due to the insulating layer 15b, electrical current hardly flows in a region under the reflecting layer 15 of the p-type semiconductor layer 13. In the example, similarly to the example shown in FIG. 6C, it is supposed that Ag is used as a material of the metal layer 15a.

Although the invention has been described with respect to the specific embodiments for complete and clear disclosure, the appended claims are not to be thus limited but are to be construed as embodying all modifications and alternative constructions that may occur to one skilled in the art which fairly fall within the basic teaching herein set forth. For example, in the above-mentioned embodiment, a face-up type light emitting element in which a light is extracted from a side of the p-type semiconductor layer has been explained, but the invention can be also applied to a face-down type light emitting element in which a light is extracted from a side of the substrate.

Although the invention has been described with respect to the specific embodiments and Examples for complete and clear disclosure, the appended claims are not to be thus limited. In particular, it should be noted that all of the combinations of features as described in the embodiment and Examples are not always needed to solve the problem of the invention.

What is claimed is:

1. A semiconductor light emitting element, comprising:
 a semiconductor multilayer structure comprising a first conductive type layer, a second conductive type layer, and a light emitting layer sandwiched between the first conductive type layer and the second conductive type layer;
 a first transparent electrode formed on the second conductive type layer;
 a reflecting layer formed on the first transparent electrode, and having a smaller area than the first transparent electrode;
 a second transparent electrode formed on the first transparent electrode so as to cover the reflecting layer; and
 a pad electrode formed on the second transparent electrode and in a region above the reflecting layer,
 wherein light emitted from the light emitting layer is extracted in a direction from the light emitting layer to the second conductive type layer,
 wherein the first and second transparent electrodes comprise a conductive metal oxide,
 wherein, in a plan view, the reflecting layer extends beyond a boundary of the pad electrode,
 wherein the reflecting layer comprises a metal and a transparent layer disposed on a bottom surface of the metal,
 wherein the transparent layer is disposed on an entirety of each of an upper surface of the metal, the bottom surface of the metal, and side surfaces of the metal, and
 wherein edges of the metal are aligned with edges of the pad electrode.

2. The semiconductor light emitting element according to claim 1, wherein a contact region of the first transparent electrode and the second transparent electrode surrounds a periphery of a bottom surface of the reflecting layer.

3. The semiconductor light emitting element according to claim 1, wherein the first transparent electrode is formed such that an electrical current flows from substantially an entire region of the first transparent electrode including a region under the reflecting layer to the second conductive type layer.

4. The semiconductor light emitting element according to claim 1, wherein the first transparent electrode comprises an upper surface having such a high flatness that it is difficult for the light reflected by the reflecting layer to be diffused by a bottom surface of the reflecting layer formed on the upper surface of the first transparent electrode.

5. The semiconductor light emitting element according to claim 1, wherein the first transparent electrode has such a conductivity that an electrical current flows in an in-plane direction in the first transparent electrode.

6. The semiconductor light emitting element according to claim 1, wherein the conductive metal oxide comprises an ITO (indium tin oxide).

7. The semiconductor light emitting element according to claim 1, wherein, in the plan view, the transparent layer extends beyond the boundary of the pad electrode.

8. The semiconductor light emitting element according to claim 1, wherein an upper surface of the first transparent electrode is configured to reduce a diffusion of light reflected by the reflecting layer by a bottom surface of the reflecting layer.

9. The semiconductor light emitting element according to claim 1, wherein a bottom surface of the first transparent electrode is disposed on the second conductive type layer, and an upper surface of the first transparent electrode is disposed on a bottom surface of the reflecting layer.

10. The semiconductor light emitting element according to claim 9, wherein the upper surface of the first transparent electrode is further disposed on a bottom surface of the second transparent electrode.

11. The semiconductor light emitting element according to claim 1, wherein the direction, which the light emitted from the light emitting layer is extracted, is parallel to a stacking direction of the semiconductor multilayer structure.

* * * * *